United States Patent [19]

Breneman et al.

[11] Patent Number: 4,931,759
[45] Date of Patent: Jun. 5, 1990

[54] MAGNETIC RESONANCE IMAGING MAGNET HAVING MINIMALLY SYMMETRIC FERROMAGNETIC SHIELD

[75] Inventors: Bruce C. Breneman; John R. Purcell; Raymond E. Sarwinski, all of San Diego, Calif.

[73] Assignee: General Atomics

[21] Appl. No.: 334,291

[22] Filed: Apr. 6, 1989

[51] Int. Cl.$^5$ .............................................. H01F 7/00
[52] U.S. Cl. ..................................... 335/301; 324/320
[58] Field of Search ................ 335/299, 301; 324/318, 324/319, 320

[56] References Cited

U.S. PATENT DOCUMENTS

| | | | |
|---|---|---|---|
| 4,590,428 | 5/1986 | Muller et al. | 324/320 |
| 4,590,452 | 5/1986 | Ries et al. | 335/301 |
| 4,612,505 | 9/1986 | Zijlstra | 324/318 |
| 4,646,045 | 2/1987 | Chari et al. | 335/301 |
| 4,646,046 | 2/1987 | Vavrek et al. | 335/301 |
| 4,694,269 | 9/1987 | Burnett et al. | 335/216 |
| 4,698,611 | 10/1987 | Vermilyea | 335/301 X |
| 4,743,853 | 5/1988 | Frese | 335/301 X |
| 4,743,880 | 5/1988 | Breneman et al. | 335/301 |
| 4,768,008 | 8/1988 | Purcell et al. | 335/216 |
| 4,782,671 | 11/1988 | Breneman et al. | 62/514 |

Primary Examiner—George Harris

[57] ABSTRACT

A magnetic resonance imaging magnet has a solenoidal superconducting winding producing a magnetic field and defining an examination region within a bore thereof. The examination region receives a body to be examined. The solenoidal superconducting winding generates a quasi-static magnetic field for aligning atomic nuclei in the body being examined. A two-fold or minimally symmetric ferromagnetic shield has a pair of magnetic flux return paths positioned on opposite sides of the solenoidal superconducting winding for reducing the magnetic field intensity in a region proximate to and outside of the solenoidal superconducting winding. A magnetic field inhomogeneity compensating system reduces magnetic field inhomogeneities introduced into the magnetic field within the examination region by the minimally symmetric ferromagnetic shield to provide a highly uniform quasi-static magnetic field within the examination region.

7 Claims, 3 Drawing Sheets

MAGNETIC RESONANCE IMAGING MAGNET HAVING MINIMALLY SYMMETRIC FERROMAGNETIC SHIELD

BACKGROUND OF THE INVENTION

The invention is related to a passive, ferromagnetic shield for a magnetic resonance imaging magnet. In particular, the invention is related to a magnet having a rectangular, ferromagnetic shield with an open top and an open bottom and an associated plurality of magnetic field inhomogeneity compensating devices for ensuring that a high homogeneity magnetic field is generated in a patient examining region within a bore of the magnet.

It is well known to employ magnetic resonance imaging techniques as a diagnostic tool in the treatment of disease. Magnetic resonance imaging equipment, however, is notoriously expensive, in part because a quasi-static or static highly homogeneous magnetic field must be generated within the examination region occupied by a patient's body. Often a superconducting magnet of the type disclosed in U.S. Pat. No. 4,782,671 for Cooling Apparatus for MRI Magnet and Method of Use and assigned to the instant assignee, is employed to generate the static magnetic field. If the quasi-static magnetic field is not homogeneous to within less than twenty parts per million over the diameter spherical volume (DSV), the field inhomogeneities can prevent an accurate depiction of the internal condition of the patient.

In addition to the requirement that the static magnetic field be highly uniform, it must also be relatively intense. As a consequence, it has been found necessary in most commercial embodiments of magnetic resonance imaging equipment to employ superconducting magnets for generating the magnetic field strengths required to image the requisite detail within the human body. As a result of having these high field strengths, it has been found that it is necessary to engage in relatively elaborate shielding of the magnetic field. The Food and Drug Administration of the United States Government has required that the magnetic resonance imaging equipment be provided with an area of exclusion bounded by a five gauss flux line or surface in order to avoid interference with other hospital diagnostic equipment, as well as with devices such as neurostimulators and cardiac pacemakers.

A number of methods have been employed in the past for shielding magnet resonance imaging magnets. In one method employing active shielding, an additional coil or coils are wound about the superconducting coil for generating a magnetic field which when added to the MRI field substantially reduces the magnetic field external to the imaging unit and thereby reduces the volume bounded by the five gauss surface. The problem with such a system is that it is relatively bulky and expensive to manufacture and often requires the use of extra superconducting magnets. The extra magnets in turn require additional cryogenic refrigeration capacity and the like. This can add as much as thirty percent to the cost of a magnetic resonance imaging system.

Other magnetic resonance imaging systems employ passive magnetic shielding. In one type of passive shielding the magnetic resonance imaging system may be placed within a room having walls consisting of ferromagnetic material which provides return paths for the magnetic flux. The room, of course, cannot be used for anything other than magnetic resonance imaging due to the high flux within the room when the superconducting magnet has current circulating in it. In addition, ferromagnetic rooms are relatively expensive to build and place high structural demands upon the building in which they are situated due to the weight of the ferromagnetic material.

Another approach to limiting the external magnetic field is to use a passive ferromagnetic shield having a plurality of symmetric magnetic return paths exterior to the magnetic resonance imaging magnet as is disclosed in U.S. Pat. No. 4,743,880 to Breneman, et al.

The number of flux return paths may be reduced in order to reduce the cost of the magnet, provide better access to the internal portions of the magnet and provide horizontal plane shielding. Unfortunately, if asymmetric instead of symmetric magnetic flux return paths are employed, it has been found that inhomogeneities are introduced into the magnetic field within the magnet bore which render the magnetic resonance imaging system useless for diagnostic purposes.

In order to provide a high-resolution image using nuclear magnetic resonance equipment, it is important to control precisely the magnitude and direction of the quasi-static magnetic field. The quasi-static magnetic vector field determines in part the frequency at which the hydrogen nuclei precessing within the magnetic field will undergo spin flips evidenced by absorption of radio frequency energy of a pre-selected frequency injected into the examination space. If the field varies in magnitude or in direction, and if a pair of gradient fields are added to it in order to provide spacial localization for the energy absorption signal, the inhomogenieties in the primary quasi-static field will reduce the resolution of the magnetic resonance imaging apparatus to the point at which it is impossible to obtain images of adequate resolution.

Another problem with which users of magnetic resonance imaging magnets are faced is compliance with Food and Drug Administration standards requiring that areas of the hospital, clinic or trailer in which the magnetic resonance magnet is located are not subject to a magnetic field intensity greater than five gauss. As a result, most magnetic resonance imaging superconducting magnets are shielded in order to reduce the volume bounded by the five gauss surface.

The shielding may take the form of a room constructed about the magnet of the type disclosed in U.S. Pat. No. 4,646,046 to Vavrek, et al. for Shielded Room Construction for Containment of Fringe Magnetic Fields. Other shields may be cylinders built about the magnet with closely spaced flux return bars of the type disclosed in U.S. Pat. No. 4,646,045 to Chari, et al. for Aperture Size Disc Shaped End Caps of a Ferromagnetic Shield for Magnetic Resonance Magnets. Still other shielding devices employ multiple flat plates, which provide flux return paths as taught in the octagonal structure disclosed in U. S. Pat. No. 4,590,452 to Ries, et al. for Magnetic Device of Apparatus in Nuclear Spin Tomography With a Shielding Device. Some prior magnets employ ferromagnetic cylindrical shells of the type disclosed in U. S. Pat. No. 4,590,428 to Muller, et al. for Electromagnet for NMR Tomography for shielding.

Other workers in the art have provided shielded magnetic structures wherein the superconducting coil wound therein is not wound on a helix, but rather is wound in a variable fashion in order to compensate for perturbations of the magnetic field by the shield, however, tesseral or off-axis components of the magnetic field cannot be compensated by variations in a substantially helically wound coil. Unfortunately, all of these prior art approaches suffer from one or more drawbacks.

The Burnett, et al. approach in U. S. Pat. No. 4,694,269 for a Magnet System and Method of Its Manufacture requires that the magnet coil be precisely wound in a shape other than a helix so that field perturbations may be compensated for. In some cases, however, customers using magnetic resonance imaging equipment in nonmedical environments may find it unnecessary to provide the type of shielding required by the FDA for use in a medical environment. As a result, if the customer elects to leave the shielding off the magnet in order to reduce cost, the pre-wound corrective coils of Burnett, et al. will introduce perturbations into the internal field in the examination space.

Complete shields of the type disclosed in Muller, et al., U. S. Pat. No. 4,590,428 are difficult to work with, since complete shields are relatively heavy, due to the weight of the ferromagnetic material, such as cold-rolled or hot-rolled steel having a thickness ranging from 1 inch to $2\frac{1}{2}$ inches. The Muller shield must be removed from the magnet before access can be had to the chambers containing the superconducting coil or the liquid helium or liquid nitrogen The system taught by Ries, et al., U. S. Pat. No. 4,590,452, renders the magnet larger than necessary, which would require that the floor of the building in which the magnet is to be located be reinforced to carry the weight of the magnet. The structure taught in U. S. Pat. No. 4,612,505 to Zijlstra for Nuclear Magnetic Resonance Apparatus employing the extremely long cylindrical bars ranged about the magnet, consumes a great deal of space which would make it undesirable to use the magnet in portable or mobile applications. The magnet of Chari, et al., U.S. Pat. No. 4,646,045 would be relatively expensive to build due to its cylindrically arranged flux return bars. In addition, the Chari magnet itself is completely enclosed, which prevents convenient access to the interior.

What is needed is a magnetic resonance imaging magnet having an easily constructed ferromagnetic return path which is relatively light and a system for compensating for magnetic field inhomogeneities introduced into the examining area of the associated superconducting magnet. The superconducting magnet should generate a solenoidal magnetic field in an examination region which is homogeneous to within less than twenty parts per million to provide a quasi-static field for the production of high resolution images by a magnetic resonance imaging apparatus.

SUMMARY OF THE INVENTION

Among the various aspects and features of the invention may be noted the provision of a shielded magnetic resonance imaging magnet and a method of shielding a magnetic field generating device.

Briefly, the magnet includes a superconducting coil for generating an intense quasi-static magnetic field. A minimally symmetric or two-fold symmetric shield partially surrounds the superconducting coils and reduces the DSV in which external magnetic field intensity exceeds five gauss. The shield covers the ends of the superconducting coil and two of the sides, but not the top and the bottom. The minimally symmetric is so named because its side plates and end plates are symmetric about a plane through a bore defining an examination region. The plane of symmetry is parallel to the side plates and transverse to the end plates. Although the shield is composed of cold-rolled or hot-rolled steel in thicknesses of one inch or more, the shield is considerably less massive than those previously used because selective horizontal shielding need only be provided. While the external field is adequately compensated by the shield, the shield introduces inhomogeneities into the magnetic field produced within an examination region within a bore of the superconducting coil. A compensating system consisting of ferromagnetic rings for compensating for zonal inhomogeneities and compensating bars for compensating for off-axis or tesseral inhomogeneities is also included. The compensating system reduces inhomogeneities in the magnetic field expressed in Legendre coefficients up to the sixth order to less than one to two parts per million over the DSV of interest.

It is a principal aspect of the present invention to provide a magnetic resonance imaging magnet having a reduced weight and size ferromagnetic shield.

It is another aspect of the present invention to provide a magnetic resonance imaging magnet having a compensating system which can reduce shield induced magnetic field inhomogeneities within an examination region.

It is a still further aspect of the present invention to provide a shielded magnetic resonance magnet having off-axis or tesseral compensating devices for reducing off-axis magnetic field inhomogeneities caused by a minimally symmetric ferromagnetic shield.

Other aspects and advantages of the present invention will become apparent to one skilled in the art upon a perusal of the following specification and claims in light of the accompanying drawings.

DETAILED DESCRIPTION OF THE PREFERRED EMBODIMENT

Figure 1:
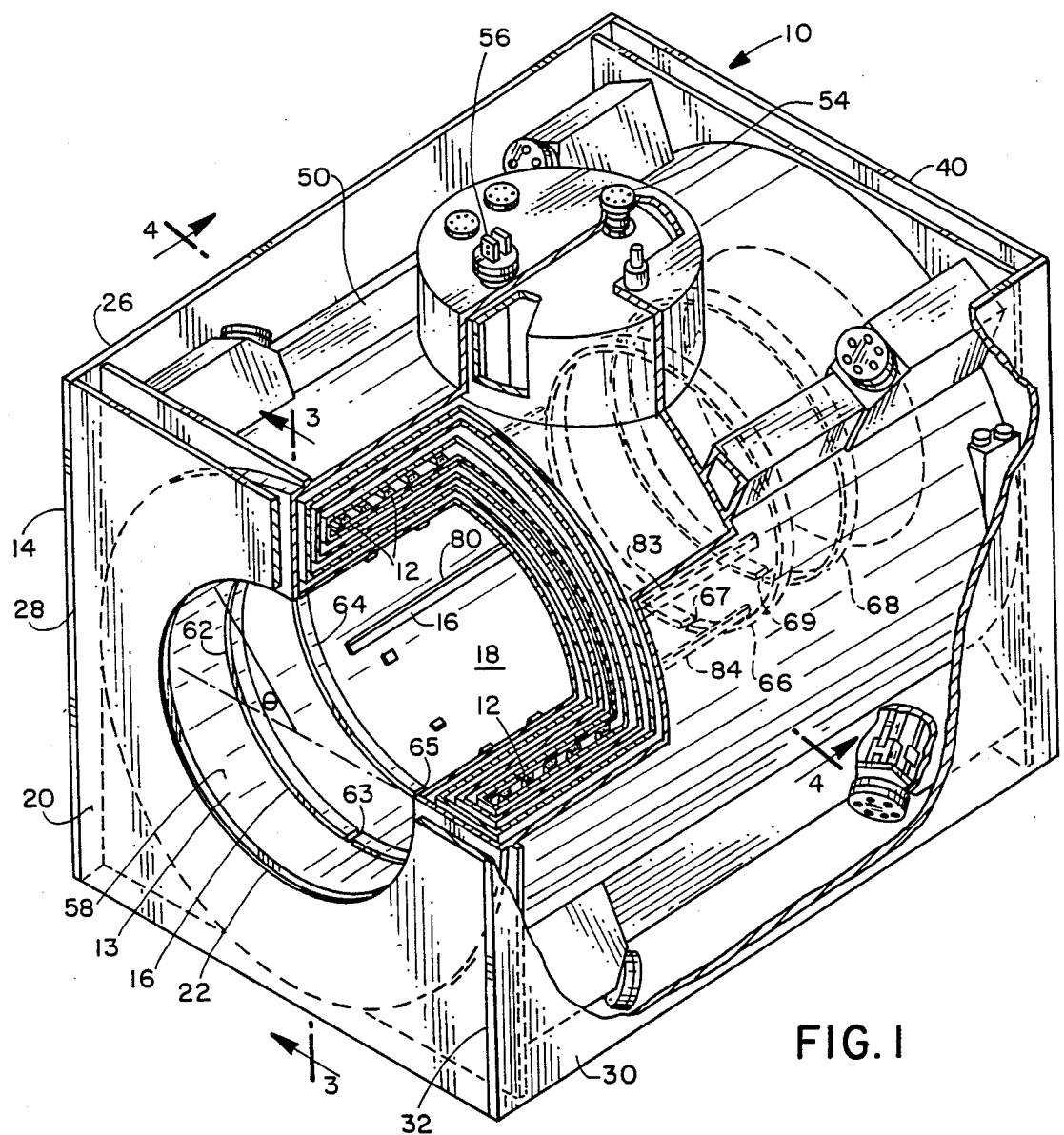
FIG. 1 is an isometric view of a shielded magnet embodying the present invention and having portions broken away to show details thereof.
Figure 2:
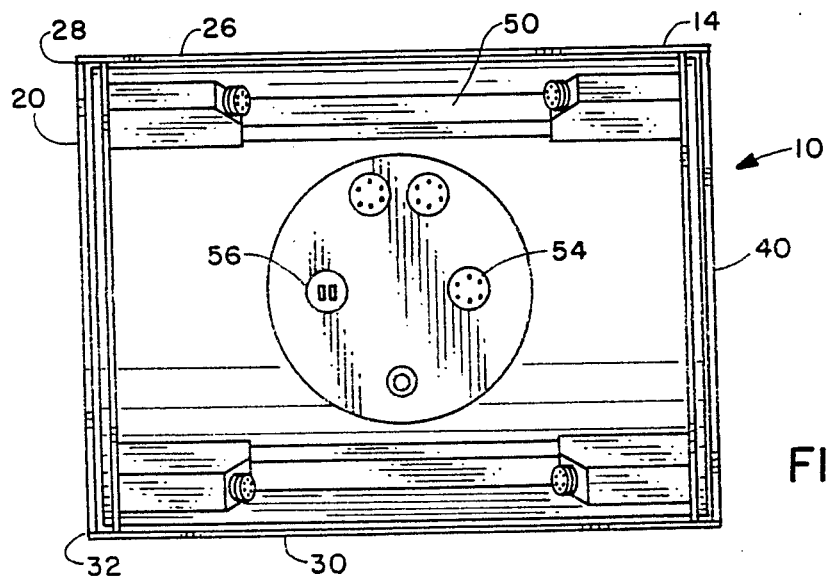
FIG. 2 is a top elevational view of the shielded magnet of FIG. 1.

Referring now to the drawings and especially to FIG. 1, a shielded magnet embodying the present invention and generally identified by numeral 10 is shown therein. The superconducting magnet 10 has means for producing a magnetic field comprising a solenoidal superconducting coil 12 defining a bore 13. A two-fold or minimally symmetric passive ferromagnetic shield 14 partially surrounds the solenoidal superconducting coil 12 for reducing the exterior magnetic flux in a region about the magnetic adjacent thereto. Means for compensating for magnetic field inhomogeneities 16 is positioned within an examination region 18 defined by the solenoidal bore 13 for receiving a patient for imaging purposes.

The solenoidal superconducting coil 12 is composed of niobium-titanium wire or other conventional superconducting materials and is wound to generate a solenoidal magnetic field within the examination region 18. The solenoidal superconducting coil 12, without more, would also generate an intense external field, this is in part due to the fact that the field within the examination region usually has an intensity of 0.3 to 1.5 tesla or 3,000 to 15,000 gauss. Since the divergence of any magnetic field must be zero, the magnetic flux exiting the examination region and entering at the opposite end of the examination region follows flux return paths within the shield 14 this creates magnetic dipoles within the compensating means whose own magnetic dipole flux return paths are superposed over the free space flux return paths and greatly reduce the external field. This lowers or eliminates the magnetic field outside the magnet where electronic and magnetic devices, such as neurostimulators and the like, otherwise might be disturbed.

Figure 6:
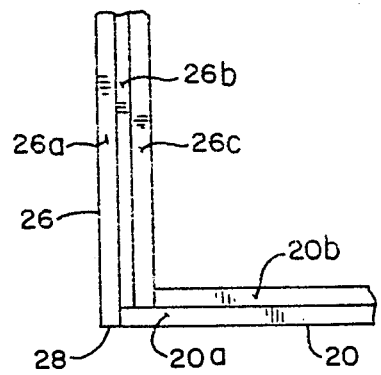
FIG. 6 is a plan view of a portion of an end wall and a side wall showing details of their construction.

Flux return paths are provided in the form of ferromagnetic material, specifically cold-rolled or hot-rolled steel. In some applications where medical imaging is to be done, the FDA has required that an exclusion area be demarcated around a magnet resonance imaging magnet to identify the region within which the field intensity exceeds 5 gauss. This is ten times the field strengths of the earth's magnetic field (0.5 gauss). In the instant invention the two-fold symmetric ferromagnetic shield 14 provides the flux return paths for reducing the DSV outside the magnet having a flux greater than 5 gauss. The portions of the flux return paths which are parallel with the examination region 18 are disposed on opposite sides of the solenoidal superconducting coil 12. The flux return paths of the two-fold symmetric ferromagnetic shield comprise a rectangular cold-rolled steel end plate 20 comprising an outer one inch thick plate 20a and an inner one inch thick plate 20b both of cold-rolled steel, and having a circular aperture 22 formed therein for access to the examination region. The plates 20a and 20b are held together by interrupted tungsten inert gas welds along their edges. A rectangular cold-rolled steel side plate 26 comprising an outer plate 26a having a thickness of one inch, an intermediate plate 26b having a thickness of one-half inch and an inner plate 26c having a thickness of one inch all of cold-rolled steel, is tungsten inert gas welded to an edge 28 of the end plate 20 as may best be seen in FIG. 6. The plates 26a, 26b and 26c are tungsten inert gas welded together by a plurality of interrupted welds along their edges. A multi-layer rectangular cold-rolled steel side plate 30 is connected to an edge 32 of the end plate 20 so that the end plate 20 and the side plates 26 and 30 provide a low reluctance path for the magnetic flux exiting the examination region 30. A multi-layer rectangular cold-rolled steel end plate 40 is connected at its edges to the side plates 26 and 30. It may be appreciated that a top portion 50 and a bottom portion 52 of the magnetic resonance imaging magnetic are left open so that a liquid nitrogen fill port 54 or a power lead access port 56 connected to the superconducting coil 12 may be accessed without having to disassemble the magnet 10 or remove a portion of the shield 14.

Figure 5:
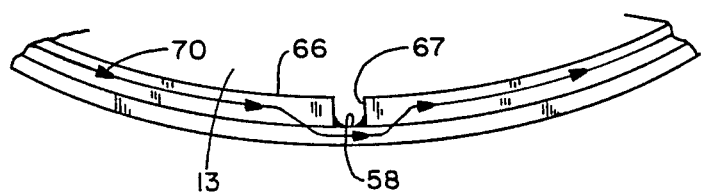
FIG. 5 is a detail view of a portion of a compensating ring positioned within the bore of the shielded magnet.

The introduction of the two-fold symmetric shield 14 however, perturbs the magnetic field within the examination region 18. In order to insure that the solenoidal field within the examination region 18 is homogeneous to within less than twenty parts per million, the compensating means 16 is employed. The compensating means 16 comprises a plurality of symmetric compensating rings 60, as may best be seen in FIGS. 1 and 3, which are positioned on opposite sides of the examination region 18 and attached by gluing or tungsten inert gas welding to an inner wall 58 defining the bore 13. The symmetric rings 60 compensate for magnetic field perturbations which cause the field intensity to change as the z-axis 19 is traversed. The symmetric compensating 60 rings are comprised of ferromagnetic material, specifically cold-rolled steel having a thickness of 1/32 inch to ½ inch and a width of 2 inches. They are disposed on opposite sides of the examination region 18. The plurality of compensating rings 60 comprises a first compensating ring 62 having an eddy current reduction gap 63, a second compensating ring 64 having an eddy current reduction gap 65, a third compensating ring 66 having an eddy current reduction gap 67, as shown in FIG. 5, and a fourth compensating ring 68 having an eddy current reduction gap 69. The compensating rings 60 each have a magnetic field induced therein by the magnetic field produced by the solenoidal superconducting coil 12. The magnetic fields induced in the compensating rings are aligned with the inducing field at locations within the compensating rings 60. Outside the compensating rings 60, the induced magnetic flux lines close in loops which are oriented substantially oppositely to the solenoidal field within the bore 13 to reduce magnetic field inhomogeneities within the examination region 18.

Gradient coils, which are not shown in the drawings must be used to generate well resolved images. As may best be seen in FIG. 5, an eddy current such as eddy current 70, is induced by time-varying magnetic fields in each of the compensating rings 62, 64, 66 and 68 when the gradient coils are pulsed. The compensating rings 62, 64, 66 and 68 are interrupted by their respective eddy current reduction gaps 63, 65, 67 and 69 each having a gap width of about one-sixteenth to one-eighth of an inch. The eddy current reduction gaps 63, 65, 67 and 69, by introducing additional electrical impedance into their respective compensating rings 62, 64, 66 and 68, reduce the eddy currents induced therein. Additionally, the gaps are short enough that the magnetic dipoles induced in the compensating rings are not effected materially.

Almost any type of passive ferromagnetic shield tends to introduce zonal inhomogeneities into the magnetic field within the examination region. However, the use of the two-fold symmetric shield of the type disclosed herein, also tends to introduce tesseral inhomogeneities into the magnetic field. Tesseral or off-axis inhomogeneities are perturbations in the magnetic field which are encountered as the angle theta changes. In order to compensate for the tesseral or off-axis inhomogeneities, a plurality of compensating bars 80, comprising compensating bars 81, 82, 83 and 84, is attached to the interior wall 58 by glue or TIG welding. The compensating bars 80 remove the $X>-Y>$ and/or $XY$ tesseral or off-axis magnetic field inhomogeneities from the magnetic field by causing a portion of the field within the examination region to be confined within the compensating bars 80. These off-axis inhomogeneities vary with the angle theta. It may be appreciated that the two-fold symmetric shield has a tendency to "flatten" the entire magnetic field, that is to increase the field strength as theta approaches zero and decrease the field strength as theta approaches D/2 or 3D/2. The compensating bars 80 are composed of rectangular cold-rolled steel members or of bundles of rods Each of the compensating members is 28 to 36 inches long. The diameter of the rods may vary from 1/32 inch in diameter and having a length of 12 inches, to ⅛ inch diameter having a length of 28 to 36 inches. Unfortunately, the compensating bars 80 also introduce zonal perturbations or z-axis perturbations within the magnetic field which must be removed.

Figure 3:
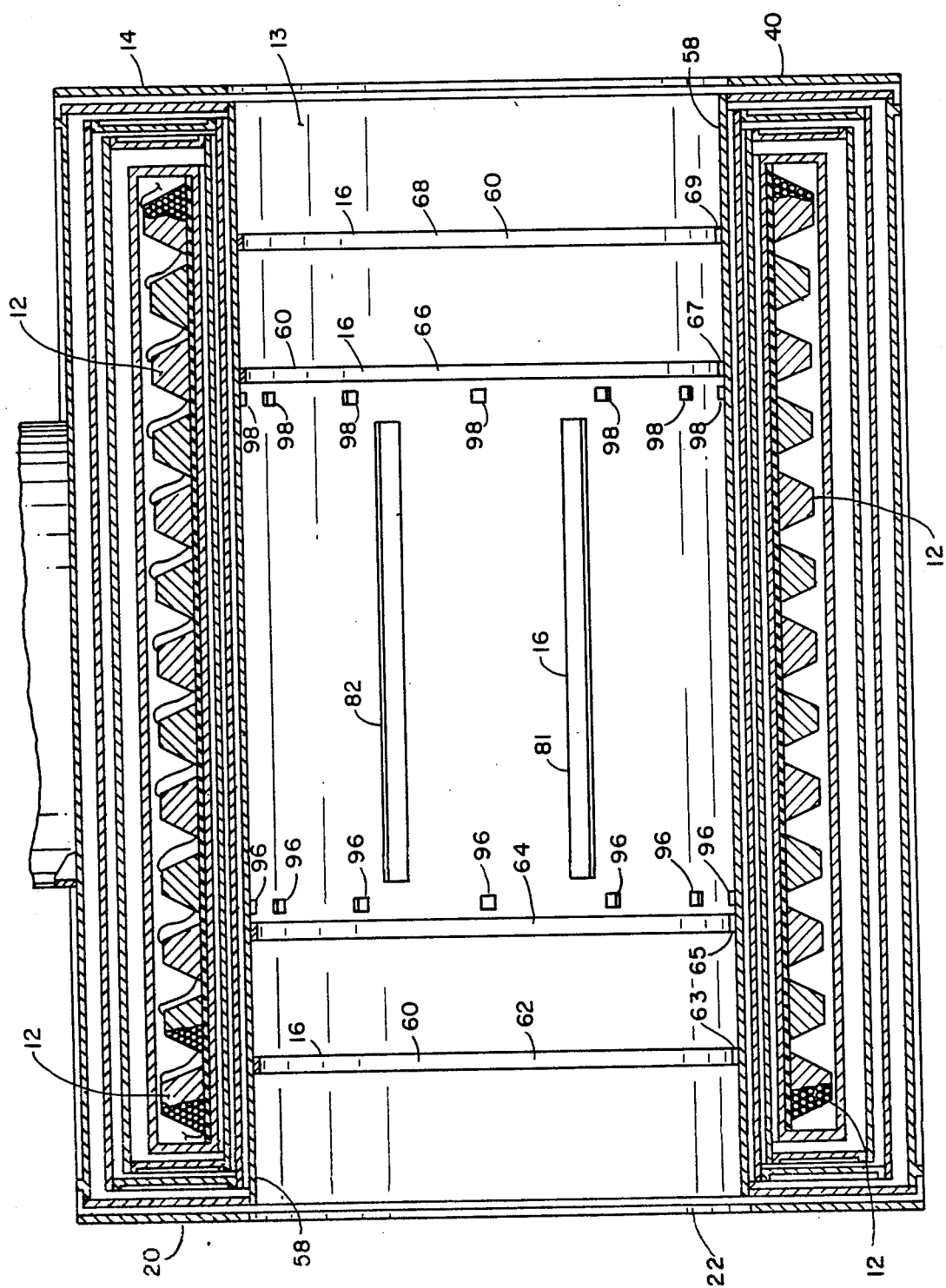
FIG. 3 is a section taken substantially along line 3—3 of FIG. 1 and showing details of the magnetic field inhomogeneity compensating structures positioned within a bore of the shielded magnet of FIG. 1.
Figure 4:
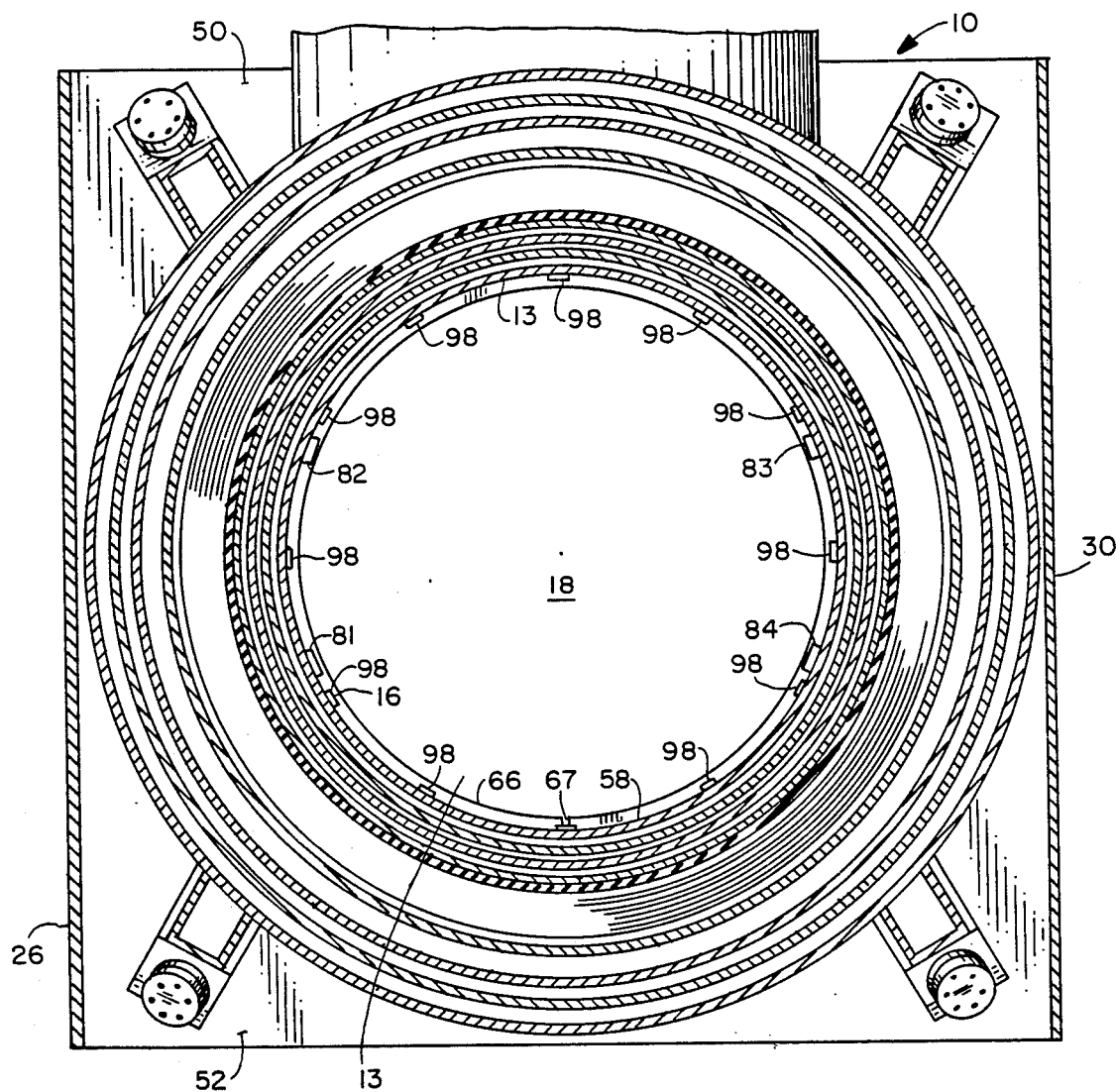
FIG. 4 is a section taken substantially along line 4—4 of FIG. 1.

In order to compensate for the zonal perturbations introduced when the tesseral perturbations are removed, a pair of dipole rings 90 and 92, as best shown in FIG. 3, positioned between the compensating rings 64 and 66, are included. The dipole ring 90 is made up of a plurality of rectangular ferromagnetic members 96, 98. The dipole ring 92 is composed of a plurality of regularly spaced identical members 98. The members 96 and 98 are spaced at from 15 to 45 degree intervals about the inside wall 58 of the magnet bore 13 with a preferred angular spacing of 30 degrees, for reducing the zonal inhomogeneities in the magnetic field. Since the members 96 are spaced apart but are spaced uniformly, the field reduction effect is angularly substantially uniform and limited by the reduced ferromagnetic mass. Thus, only a small field reduction or fine tuning of the magnetic field is effected by the dipole rings 90 and 92. Each of the members 96 of the dipole rings 90 and 92 is made of cold-rolled or hot-rolled steel and is a rectangle having a width of 2 inches, a length of 1 inch and a thickness which may range from 1/32 of an inch to ¼ of an inch. Although space limitations prevent solid dipole rings from being used in place of the spaced element dipole rings 90 and 92, it may be appreciated that in other embodiments solid dipole compensating may be employed instead of the spaced element rings.

The combination of the symmetric compensating rings 60, the tesseral compensating bars 80 and the dipole rings 90 and 92 allows the two-fold symmetric shield to adequately reduce the magnetic flux outside the magnet while maintaining the field homogeneity within the examining region 18, as expressed in Legendre coefficients, to within 1 or 2 parts per million. This allows high resolution magnetic resonance imaging to be carried out.

It may be appreciated that since the shield is added after the superconducting coil 12 is wound, it is necessary to provide the field inhomogeneity compensation within the examination region 18. The use of this system also allows the shield 14 to be left off the magnet 10 without having to rewind the superconducting coil 12. When the shield 14 is left off, the symmetric compensating rings 60, the compensating bars 80 and the dipole rings 90 and 92 are also be left out, thereby reducing significantly the cost of the resulting unshielded magnetic resonance imaging magnet. Furthermore, the two-fold symmetric shield is considerably less massive than other designs since ferromagnetic material does not cover approximately one-half of the angular area of the magnet surface. Although large portions of the coil are left open, providing a relatively low mass but effective shield in the horizontal plane, the perturbations which would normally be induced are adequately removed by the use the longitudinal tesseral compensating bars.

While there has been illustrated and described a particular embodiment of the present invention, it will be appreciated that numerous changes and modifications will occur to those skilled in the art and it is intended in the appended claims to cover all those changes and modifications which fall within the true spirit and scope of the present invention.

What is claimed is:

1. A magnet for a magnetic resonance imaging apparatus comprising:
    means for producing a magnetic field in an examination region;
    a minimally symmetric magnetic shield partially enclosing the magnetic field producing means and providing a magnetic flux return path for reducing a magnetic field intensity external to the magnetic field producing means; and
    compensation means for compensating for perturbations of the magnetic field within the examination region caused by the minimally symmetric magnetic shield, the compensation means comprising a first symmetric compensating ring positioned at a first end of the examination region and a second symmetric compensating ring positioned at a second end of the examination region, the first symmetric compensating ring and the second symmetric compensating ring reducing zonal inhomogeneities in the magnetic field within the examination region, said compensation means further comprising a third symmetric compensating ring positioned at the first end of the examination region and a fourth symmetric compensating ring positioned at the second end of the examination region, the third symmetric compensating ring and the fourth symmetric compensating ring further reducing zonal inhomogeneities in the magnetic field in the examination region.

2. A magnet for a magnetic resonance imaging apparatus as defined in claim 1, wherein the magnetic field producing means comprises a solenoidal superconducting magnet wound about the examination region.

3. A magnet for a magnetic resonance imaging apparatus as defined in claim 1, wherein the compensation means comprises a plurality of longitudinal compensating bars positioned within the examination region for reducing tesseral inhomogeneities in the magnetic field within the examination region.

4. A magnet for a magnetic resonance imaging apparatus comprising:
    means for producing a magnetic field in an examination region;
    a minimally symmetric magnetic shield partially enclosing the magnetic field producing means and providing a magnetic flux return path for reducing a magnetic field intensity external to the magnetic field producing means; and
    compensation means for compensating for perturbations of the magnetic field within the examination region caused by the minimally symmetric magnetic shield, said compensation means comprising a plurality of dipole compensation members distributed circumferentially about the examination region and reducing zonal inhomogeneities in the magnetic field within the examination region.

5. A magnet for a magnetic resonance imaging apparatus as defined in claims 1 or 4, wherein the minimally symmetric magnetic shield further comprises a first ferromagnetic end plate having a first examination region access port therein and a second ferromagnetic end plate.

6. A magnet for a magnetic resonance imaging apparatus as defined in claim 5, wherein the minimally symmetric magnetic shield further comprises a first ferromagnetic side wall connected between the first ferromagnetic end plate and the second ferromagnetic end plate, and a second ferromagnetic side wall connected between the first ferromagnetic end plate and the second ferromagnetic end plate, the first ferromagnetic side wall and the second ferromagnetic side wall shielding a region around the magnetic producing means from the magnetic field.

7. A magnet for a magnetic resonance imaging apparatus as defined in claim 6, wherein the first ferromagnetic side wall is planar and the second ferromagnetic side wall is planar.

* * * * *